(12) United States Patent
Lee

(10) Patent No.: US 10,825,463 B2
(45) Date of Patent: Nov. 3, 2020

(54) ELECTRONIC DEVICE AND METHOD FOR CONTROLING THE ELECTRONIC DEVICE THEREOF

(71) Applicant: SAMSUNG ELECTRONICS CO., LTD., Suwon-si, Gyeonggi-do (KR)

(72) Inventor: Jaecheol Lee, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 16/595,892

(22) Filed: Oct. 8, 2019

(65) Prior Publication Data

US 2020/0202881 A1 Jun. 25, 2020

(30) Foreign Application Priority Data

Dec. 21, 2018 (KR) .......................... 10-2018-0167515

(51) Int. Cl.
*G10L 21/0232* (2013.01)
*H03F 3/183* (2006.01)
(Continued)

(52) U.S. Cl.
CPC .......... *G10L 21/0232* (2013.01); *H03F 3/183* (2013.01); *H03G 3/3005* (2013.01);
(Continued)

(58) Field of Classification Search
CPC ....... G10L 21/0232; G10L 2021/02082; H03F 3/183; H03F 2200/03; H03G 3/005; H03G 5/165; H03G 2201/103; H04R 3/04
See application file for complete search history.

(56) References Cited

U.S. PATENT DOCUMENTS 7,742,746 B2 6/2010 Xiang et al.
9,514,763 B2 12/2016 Kapinos
(Continued)

FOREIGN PATENT DOCUMENTS

JP 5448446 3/2014
KR 10-1120970 3/2012
(Continued)

OTHER PUBLICATIONS

European Office Action dated May 12, 2020 for European Application No. 19205965.7.

*Primary Examiner* — Andrew L Sniezek
(74) *Attorney, Agent, or Firm* — Nixon & Vanderhye P.C.

(57) ABSTRACT

An electronic device and a controlling method therefor are provided. The electronic device includes a speaker, a microphone, and an audio processor configured to adjust a size of a signal of a predetermined frequency band in an input audio signal, determine whether to adjust the size of the audio signal wherein the size of the frequency band was adjusted based on the output level of the speaker, and output the audio signal processed based on whether the adjustment was performed through the speaker. The audio processor is further configured to perform acoustic echo cancellation for the sound signal using the input audio signal or the audio signal of which size was adjusted based on whether the adjustment was performed, based on receiving a sound signal including the output audio signal through the microphone.

18 Claims, 10 Drawing Sheets

(51) Int. Cl.
*H03G 3/30* (2006.01)
*H03G 5/16* (2006.01)
*H04R 3/04* (2006.01)
*G10L 21/0208* (2013.01)

(52) U.S. Cl.
CPC ............... *H03G 5/165* (2013.01); *H04R 3/04* (2013.01); *G10L 2021/02082* (2013.01); *H03F 2200/03* (2013.01); *H03G 2201/103* (2013.01)

(56) References Cited

U.S. PATENT DOCUMENTS

| | | | |
|---|---|---|---|
| 9,813,808 | B1 | 11/2017 | Yang |
| 10,051,370 | B2 | 8/2018 | Kim et al. |
| 2006/0262938 | A1 | 11/2006 | Gauger et al. |
| 2011/0093102 | A1 | 4/2011 | Aichner et al. |
| 2012/0294437 | A1* | 11/2012 | Haddad ................ H03G 3/3089 |
| | | | 379/406.05 |
| 2019/0165832 | A1* | 5/2019 | Khanduri ................ H04B 3/237 |

FOREIGN PATENT DOCUMENTS

| | | |
|---|---|---|
| KR | 10-1538400 | 7/2015 |
| KR | 10-2017-0083351 | 7/2017 |
| WO | WO 2014/193874 | 12/2014 |
| WO | 2017/010609 | 1/2017 |

\* cited by examiner

ELECTRONIC DEVICE AND METHOD FOR CONTROLLING THE ELECTRONIC DEVICE THEREOF

CROSS-REFERENCE TO RELATED APPLICATION

This application is based on and claims priority under 35 U.S.C. § 119(a) to Korean Patent Application No. 10-2018-0167515, filed on Dec. 21, 2018, in the Korean Intellectual Property Office, the disclosure of which is incorporated by reference herein in its entirety.

BACKGROUND

1. Field

The disclosure relates to an electronic device and a controlling method therefor, and for example, to an electronic device that cancels acoustic echo and a controlling method therefor.

2. Description of Related Art

With the development of electronic technologies, nowadays, electronic devices receive input of user voices, and provide responses to user voices. For example, with respect to a user voice inquiring about the weather, an electronic device may provide information on the current weather to the user.

Meanwhile, in the case of an electronic device having a built-in speaker, it performs acoustic echo cancellation (AEC) by comparing an audio signal output from the speaker with an audio signal input into a microphone, for improving a voice recognition rate.

However, in the case of the conventional system, it could not perform optimal acoustic echo cancellation, and accordingly, there was a problem that a voice recognition rate for a user voice deteriorated due to an audio signal output from an electronic device.

SUMMARY

Embodiments of the disclosure address the aforementioned problem, and the disclosure provides an electronic device that performs acoustic echo cancellation for an audio signal received through a microphone using a specific audio signal according to whether the electronic device operates, and a controlling method therefor.

An electronic device according to an embodiment of the disclosure includes a speaker, a microphone, and an audio processor configured to adjust a size of a signal of a predetermined frequency band in an input audio signal, determine whether to adjust the size of the audio signal wherein the size of the frequency band was adjusted based on the output level of the speaker, and output the processed audio signal based on whether the adjustment was performed through the speaker. The audio processor may, based on receiving a sound signal including the output audio signal through the microphone, perform acoustic echo cancellation (AEC) for the sound signal using the input audio signal or the audio signal of which size was adjusted based on whether the adjustment was performed.

The audio processor may include an equalizer configured to adjust the size of the signal of a predetermined frequency band in the input audio signal, a dynamic range controller comprising dynamic range controlling circuitry configured to adjust the size of the audio signal output from the equalizer based on the output level of the speaker, and an audio amplifier configured to amplify the audio signal output from the dynamic range controller.

The audio processor may perform the acoustic echo cancellation using the audio signal input into the equalizer or the audio signal output from the dynamic range controller based on whether the size of the audio signal output from the equalizer was adjusted by the dynamic range controller.

In addition, the audio processor may, based on the size of the audio signal output from the equalizer not having been adjusted by the dynamic range controller, be configured to perform the acoustic echo cancellation based on the audio signal input into the equalizer.

The audio processor may, based on the size of the audio signal output from the equalizer having been adjusted by the dynamic range controller, be configured to perform the acoustic echo cancellation based on the audio signal output from the dynamic range controller.

The audio processor may be configured to adjust the size of the signal of a predetermined frequency band in the audio signal output from the dynamic range controller set in advance according to the property of the speaker to be opposite to the equalizer, and perform the acoustic echo cancellation based on the adjusted audio signal.

The sound signal wherein acoustic echo was cancelled may be used for voice recognition.

The predetermined frequency band may be a frequency band set in advance according to the property of the speaker.

The adjustment of the size of the signal of a frequency band set in the input audio signal may be adjustment based on the property of the speaker such that a difference between the audio signal output from the speaker and the input audio signal is compensated.

A method of controlling an electronic device comprising a microphone and a speaker includes the steps of adjusting the size of a signal of a predetermined frequency band in an input audio signal, determining whether to adjust the size of the audio signal wherein the size of the frequency band was adjusted based on the output level of the speaker, and outputting the audio signal processed based on whether the adjustment was performed through the speaker, and based on receiving a sound signal including the output audio signal through the microphone, performing acoustic echo cancellation (AEC) for the sound signal using the input audio signal or the audio signal of which size was adjusted based on whether the adjustment was performed.

In the adjusting step, the size of a signal of a predetermined frequency band in the input audio signal may be adjusted using an equalizer. In the outputting step, the size of the audio signal output from the equalizer may be adjusted based on the output level of the speaker using a dynamic range controller, and the audio signal output from the dynamic range controller may be amplified and output through the speaker.

in the outputting step, the acoustic echo cancellation may be performed using the audio signal input into the equalizer or the audio signal output from the dynamic range controller based on whether the size of the audio signal output from the equalizer was adjusted by the dynamic range controller.

In the performing step, in case the size of the audio signal output from the equalizer was not adjusted by the dynamic range controller, the acoustic echo cancellation may be performed based on the audio signal input into the equalizer.

In the performing step, in case the size of the audio signal output from the equalizer was adjusted by the dynamic range controller, the acoustic echo cancellation may be performed based on the audio signal output from the dynamic range controller.

In the performing step, the size of the signal of a predetermined frequency band in the audio signal output from the dynamic range controller may be adjusted to be opposite to the equalizer, and the acoustic echo cancellation may be performed based on the adjusted audio signal.

The sound signal wherein acoustic echo was cancelled may be used for voice recognition.

The predetermined frequency band may be a frequency band set in advance according to the property of the speaker.

The adjustment of the size of the signal of a frequency band set in the input audio signal may be adjustment based on the property of the speaker such that a difference between the audio signal output from the speaker and the input audio signal is compensated.

According to the various example embodiments of the disclosure, acoustic echo cancellation may be performed effectively.

BRIEF DESCRIPTION OF THE DRAWINGS

The above and other aspects, features and advantages of certain embodiments of the present disclosure will be more apparent from the following detailed description, taken in conjunction with the accompanying drawings, in which.

DETAILED DESCRIPTION

Figure 1:
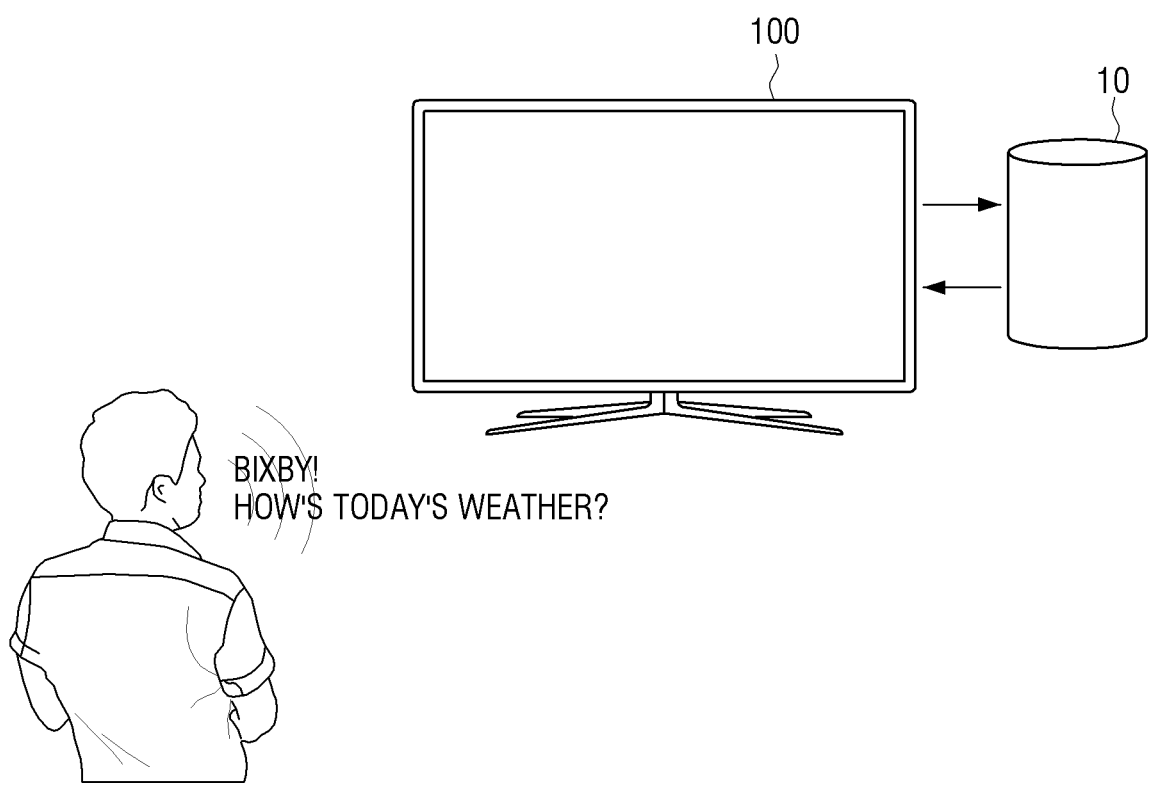
FIG. 1 is a diagram illustrating example usage of an artificial intelligence agent system according to an embodiment of the disclosure.

Hereinafter, various example embodiments of the disclosure will be described with reference to the accompanying drawings. However, it should be noted that the various example embodiments are not for limiting the technology described in the disclosure to a specific embodiment, but they should be interpreted to include various modifications, equivalents, and/or alternatives of the embodiments of the disclosure. Also, with respect to the detailed description of the drawings, similar components may be designated by similar reference numerals.

In the disclosure, expressions such as "have," "may have," "include," and "may include" should be construed as denoting that there are such characteristics (e.g., elements such as numerical values, functions, operations, and components), and the expressions are not intended to exclude the existence of additional characteristics.

Also, in the disclosure, the expressions "A or B," "at least one of A and/or B," or "one or more of A and/or B" and the like may include all possible combinations of the listed items. For example, "A or B," "at least one of A and B" or "at least one of A or B" refer to all of the following cases: (1) including at least one A, (2) including at least one B, or (3) including at least one A and at least one B.

In addition, the expressions "first," "second," and the like used in the disclosure may be used to describe various elements regardless of any order and/or degree of importance. Also, such expressions are used only to distinguish one element from another element, and are not intended to limit the elements.

In addition, the description in the disclosure that one element (e.g.: a first element) is "(operatively or communicatively) coupled with/to" or "connected to" another element (e.g.: a second element) should be interpreted to include both the case where the one element is directly coupled to the another element, and the case where the one element is coupled to the another element through still another element (e.g.: a third element). On the other hand, where one element (e.g.: a first element) is "directly coupled" or "directly connected" to another element (e.g.: a second element), another element (e.g.: a third element) does not exist between the one element and the another element.

Further, the expression "configured to" used in the disclosure may be interchangeably used with other expressions such as "suitable for," "having the capacity to," "designed to," "adapted to," "made to," and "capable of," depending on cases. Meanwhile, the term "configured to" does not necessarily refer to a situation in which a device is "specifically designed to" in terms of hardware. Instead, under some circumstances, the expression "a device configured to" may refer, for example, to a situation in which the device "is capable of" performing an operation together with another device or component. For example, the phrase "a processor configured to perform A, B, and C" may refer, for example, to a dedicated processor (e.g.: an embedded processor) for performing the corresponding operations, or a generic-purpose processor (e.g.: a central processing unit (CPU) or an application processor) that can perform the corresponding operations by executing one or more software programs stored in a memory device.

Hereinafter, the disclosure will be described in greater detail with reference to the drawings.

FIG. 1 is a diagram illustrating example usage of an artificial intelligence agent system according to an embodiment of the disclosure.

The artificial intelligence agent system may include an electronic device 100 and a response provision server 10, as illustrated in FIG. 1. In FIG. 1, it was illustrated that the electronic device 100 is a television, but this is merely an example, and the disclosure is not limited thereto.

An electronic device according to various embodiments of the disclosure may include, for example, at least one of a smartphone, a tablet PC, a mobile phone, a video phone, an e-book reader, a desktop PC, a laptop PC, a netbook computer, a workstation, a server, a PDA, a portable multimedia player (PMP), an MP3 player, a medical instrument, a camera, a wearable device, etc., but is not limited thereto. A wearable device may include at least one of an accessorytype device (e.g.: a watch, a ring, a bracelet, an ankle bracelet, a necklace, glasses, a contact lens, or a head-mounted-device (HMD)), a device integrated with fabrics or clothing (e.g.: electronic clothing), a body-attached device (e.g.: a skin pad or a tattoo), an implantable circuit, or the like, but is not limited thereto. Also, in some embodiments, an electronic device may include at least one of, for example. a digital video disk (DVD) player, an audio, a refrigerator, an air conditioner, a cleaner, an oven, a microwave oven, a washing machine, an air cleaner, a set top box, a home automation control panel, a security control panel, a media box, a game console, an electronic dictionary, an electronic key, a camcorder, an electronic photo frame, or the like, but is not limited thereto.

In another embodiment of the disclosure, an electronic device may include at least one of various types of medical instruments (e.g.: various types of portable medical measurement instruments (a blood glucose meter, a heart rate meter, a blood pressure meter, or a thermometer, etc.), magnetic resonance angiography (MRA), magnetic resonance imaging (MRI), computed tomography (CT), a photographing device, or an ultrasonic instrument, etc.), a navigation device, a global navigation satellite system (GNSS), an event data recorder (EDR), a flight data recorder (FDR), a vehicle infotainment device, an electronic device for vessels (e.g.: a navigation device for vessels, a gyrocompass, etc.), avionics, a security device, a head unit for a vehicle, an industrial or a household robot, a drone, an ATM of a financial institution, a point of sales (POS) of a store, an Internet of things (IoT) device (e.g.: a light bulb, various types of sensors, a sprinkler device, a fire alarm, a thermostat, a street light, a toaster, exercise equipment, a hot water tank, a heater, a boiler, etc.), or the like, but is not limited thereto.

As described above, an electronic device according to various embodiments of the disclosure may be implemented as electronic devices in various types.

The electronic device 100 may provide a response to a user voice to the user using an artificial intelligence agent program.

The electronic device 100 may receive input of a user voice including a trigger word for activating the artificial intelligence agent program before receiving input of a user voice. For example, the electronic device 100 may receive input of a user voice including a trigger word such as "Bixby." When a user voice including a trigger word is input, the electronic device 100 may execute or activate the artificial intelligence agent program, and wait for input of a user voice. The artificial intelligence agent program may include a conversation system that is capable of processing a user voice and a response as a natural language. For example, the electronic device 100 may receive input of a user voice after a specific button provided on the electronic device 100 is selected, other than a trigger word for activating the artificial intelligence agent program.

The electronic device 100 may receive input of a user voice. For example, as illustrated in FIG. 1, the electronic device 100 may receive input of a user voice "How's the weather today?" The electronic device 100 may determine keywords such as "today" and "weather" from "How's the weather today?" and provide the keywords to the response provision server 10.

The response provision server 10 may provide a response to the user voice based on the keywords received from the electronic device 100. For example, the response provision server 100 may provide a response "The temperature is 22□" to the electronic device 100. In this example, the response provision server 10 may provide a response including a text, but this is merely an example, and the response provision server 10 may provide a response in the form of a natural language.

The electronic device 100 may output a response. The electronic device 100 may process the response as a natural language using the conversation system and output the response. For example, the electronic device 100 may provide a response in the form of a natural language, "Today's temperature is 22□."

The electronic device 100 may use an artificial intelligence agent for providing a response to a user voice as described above. The artificial intelligence agent may, for example, be a dedicated program for providing a service based on artificial intelligence (AI) (e.g., a voice recognition service, an agent service, a translation service, a search service), and may be executed by a conventional generic-purpose processor (e.g., a CPU) or a separate AI-dedicated processor (e.g., a GPU). For example, the artificial intelligence agent may control various modules (e.g., a conversation system).

As described above, according to an embodiment of the disclosure, the electronic device 100 may receive input of a user voice, and provide a response thereto.

In case an audio signal (or, audio, sound, etc.) output through the speaker of the electronic device 100 is input as an echo signal through the microphone of the electronic device 100, the recognition rate of a user voice of the electronic device 100 may deteriorate due to the echo signal.

Accordingly, for preventing and/or reducing deterioration of the performance of the electronic device 100 by the echo signal, the echo signal may be removed by performing acoustic echo cancellation (AEC).

Figure 2:
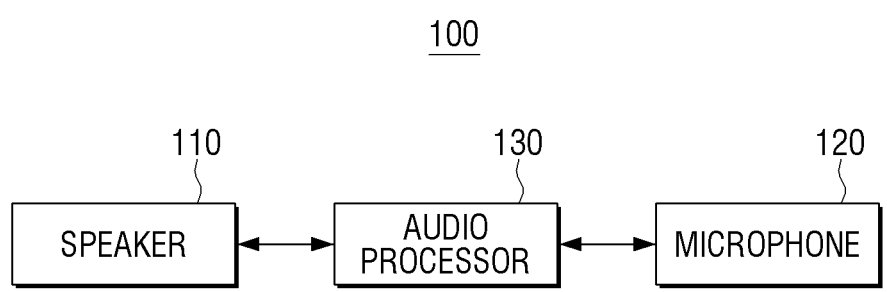
FIG. 2 is a block diagram illustrating an example configuration of an example electronic device according to an embodiment of the disclosure.

FIG. 2 is a block diagram illustrating an example configuration of an example electronic device according to an embodiment of the disclosure.

Referring to FIG. 2, the electronic device 100 includes a speaker 110, a microphone 120, and an audio processor (e.g., including audio processing circuitry and/or executable program elements) 130.

The speaker 110 may output an audio signal (or, audio, sound, etc.). Specifically, the speaker 110 may output an audio signal processed at the audio processor 130.

The microphone 120 may receive an input of a sound signal. For example, the microphone 120 may receive a sound signal including a voice signal uttered by a user, an audio signal output from the speaker 110, etc.

The audio processor 130 may, for example, include various audio processing circuitry and process an audio signal. The audio processor 130 may include hardware such as a processor for processing an audio signal and/or software such as a program for processing an audio signal, etc.

For example, the audio processor 130 may adjust the size of a signal of a predetermined frequency band in an input audio signal, determine whether to adjust the size of the audio signal wherein the size of the frequency band was adjusted based on the output level of the speaker 110, and output the audio signal processed based on whether the adjustment was performed through the speaker 110.

Figure 3:
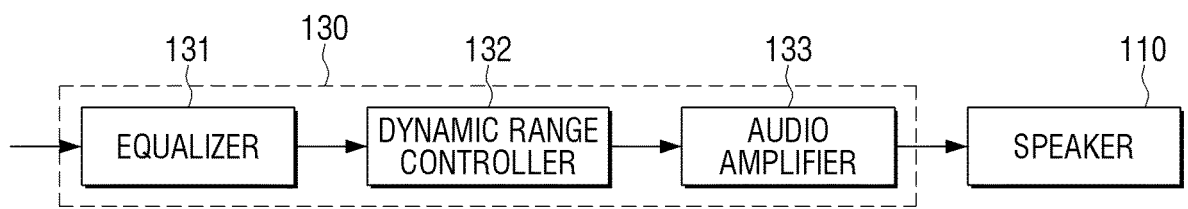
FIG. 3 is a block diagram illustrating an example configuration of an example audio processor according to an embodiment of the disclosure.

The audio processor 130 may include components as illustrated in FIG. 3.

Referring to FIG. 3, the audio processor 130 may include an equalizer 131, a dynamic range controller 132, and an audio amplifier 133. Each of the components illustrated in FIG. 3 may be implemented as hardware including circuitry, and depending on embodiments, they may be implemented as software for performing the function of each component.

The equalizer (EQ) 131 may adjust the size of a signal of a predetermined frequency band in an input audio signal. The equalizer 131 may include a filter for adjusting the size of a signal of a specific frequency band in an audio signal.

For example, the speaker 110 may output a signal of a specific frequency band to be weak, or output a signal of a specific frequency band to be strong according to its unique property. Accordingly, the equalizer 131 may increase or decrease the size of a signal of a specific frequency band in an audio signal, for correcting an audio signal that is output to be weak or strong through the speaker 110, according to the property of the speaker 110. As a frequency band of which size is adjusted by equalizing is determined according to the unique property of the speaker 110, the frequency band may have been set in advance. As described above, the equalizer 131 may perform a function of a compensation circuit that performs a role of compensating the property of the speaker 110. That is, adjustment of the size of a signal of a frequency band set in an input audio signal may be adjustment based on the property of the speaker 110, such that a difference between an audio signal output from the speaker 110 and an input audio signal is compensated.

The dynamic range controller (DRC) 132 may adjust the size of an audio signal output from the equalizer 131 based on the output level of the speaker 110.

For example, the dynamic range controller 132 may adjust the size of an audio signal output from the equalizer 131 to an appropriate size in consideration of the output level of the speaker 110.

For example, in case the size of an audio signal is larger than the level of an audio signal that can be output from the speaker 110, the dynamic range controller 132 may clip a portion of the audio signal that has high amplitude, and decrease or limit the size of the portion. In case the size of an audio signal is smaller than the level of an audio signal that can be output from the speaker 110, the dynamic range controller 132 may output the audio signal to the audio amplifier 133, without adjusting the size of the audio signal input from the equalizer 131.

As described above, the dynamic range controller 132 may adjust the size of an audio signal, in consideration of the output level of the speaker 110 and the size of an input audio signal.

The audio amplifier 133 may amplify an audio signal output from the dynamic range controller 132. In this case, the speaker 110 may output the audio signal input from the audio amplifier 133.

The equalizer 131, the dynamic range controller 132, and the audio amplifier 133 illustrated in FIG. 3 may be implemented separately, or, the equalizer 131 and the dynamic range controller 132 may be implemented as one integrated circuit (IC), or the equalizer 131, the dynamic range controller 132, and the audio amplifier 133 may be implemented as one IC.

As the equalizer 131, the dynamic range controller 132, and the audio amplifier 133 are components that may be already known, a further detailed explanation in that regard may not be provided.

The audio processor 130 may perform acoustic echo cancellation, for preventing and/or reducing deterioration of performance by an echo signal.

As an example, the audio processor 130 may set a specific audio signal as reference data (echo reference), and through frequency analysis, determine a signal having a similar frequency property to reference data in a sound signal input through the microphone 120 of the electronic device 100, and remove or attenuate the signal.

As described above, for removing an echo signal, reference data should be set. In this regard, according to an embodiment of the disclosure, a specific audio signal is selected based on whether adjustment by the dynamic range controller 132 was performed, and the audio signal is set as reference data for removal of an echo signal. This will be described in more detail with reference to FIGS. 4 to 8 below.

For example, when a sound signal including an audio signal output through the speaker 110 is received through the microphone 120, the audio processor 130 may perform acoustic echo cancellation for the sound signal using the input audio signal or the audio signal of which size was adjusted based on whether adjustment was performed.

For example, the audio processor 130 may perform acoustic echo cancellation using the audio signal input into the equalizer 131 or the audio signal output from the dynamic range controller 132 based on whether the size of the audio signal output from the equalizer 131 was adjusted by the dynamic range controller 132.

In case the size of the audio signal output from the equalizer 131 was not adjusted by the dynamic range controller 132, the audio processor 130 may perform acoustic echo cancellation based on the audio signal input into the equalizer 131.

For example, in case the size of the audio signal output from the equalizer 131 was not adjusted by the dynamic range controller 132, the audio processor 130 may determine a signal having a similar frequency property to the audio signal input into the equalizer 131 in a sound signal input through the microphone 120 as an echo signal, and remove the signal.

Figure 4:
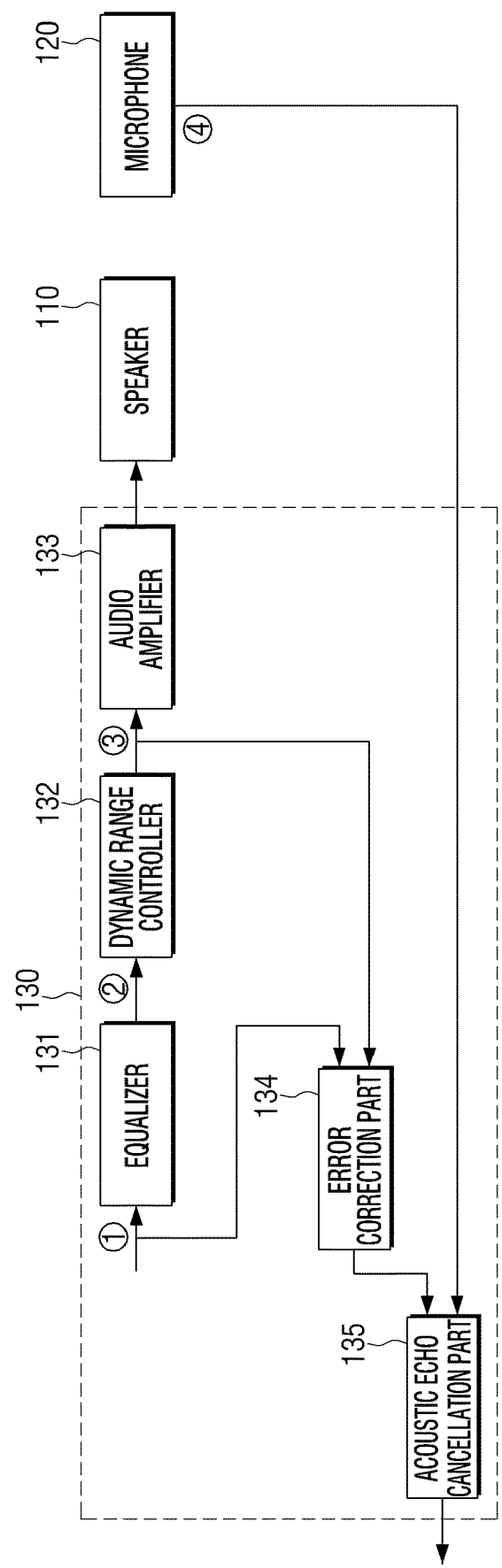
FIG. 4 is a block diagram illustrating an example audio processor according to an embodiment of the disclosure.

In this example, the audio processor 130 may include an error correction part (e.g., including error correction circuitry and/or executable program elements) 134 and an acoustic echo cancellation part (e.g., including acoustic echo cancellation circuitry and/or executable program elements) 135, as illustrated in FIG. 4. These components may be implemented as hardware including circuitry, and depending on embodiments, they may be implemented as software for performing the function.

Figure 5:
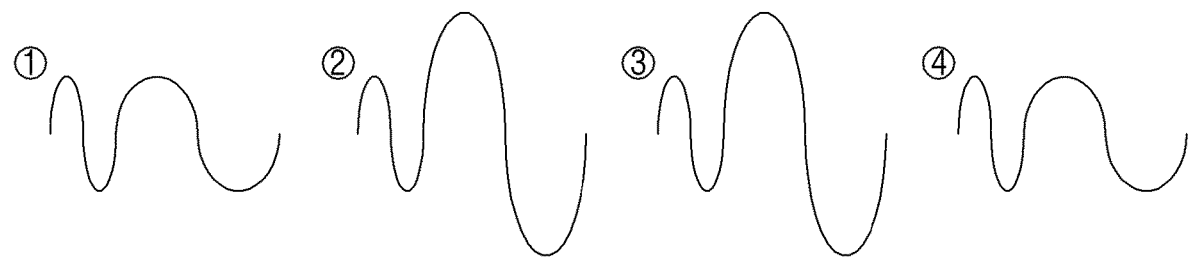
FIG. 5 is a diagram illustrating example waveforms of an audio signal according to an embodiment of the disclosure.

Specifically, the audio signal ① input into the equalizer 131 may be expressed as a waveform as ① in FIG. 5.

In this example, if the equalizer 131 amplifies the size of a signal of a low frequency band in the audio signal, the audio signal ② output from the equalizer 131 may be expressed as a waveform as ② in FIG. 5.

In case the size of the audio signal was not adjusted at the dynamic range controller 132, the audio signal ③ output from the dynamic range controller 132 may be expressed as a waveform as ③ in FIG. 5. In this example, as a separate operation was not performed at the dynamic range controller 132, the waveform of the audio signal ② and the waveform of the audio signal ③ may be identical.

When the audio signal is output through the speaker 110, the strength of the signal of a low frequency band becomes weak due to the property of the speaker 110. Thus, if the audio signal output through the speaker 110 is input into the microphone 120, the signal input into the microphone 120 may have a waveform as ④ in FIG. 5.

In case the size of the audio signal was not adjusted at the dynamic range controller 132, the error correction part 134 outputs the audio signal input into the equalizer 131 between the audio signal input into the equalizer 131 and the audio signal output from the dynamic range controller 132 to the acoustic echo cancellation part 135.

Accordingly, the acoustic echo cancellation part 135 removes an echo signal in a sound signal input into the microphone 120 using the audio signal input from the error correction part 134, and outputs the audio signal wherein the eco signal was removed.

For example, the acoustic echo cancellation part 135 may set the audio signal input into the equalizer 131 as reference data, and through frequency analysis, determine a signal having a similar frequency property to reference data in a sound signal input through the microphone 120, and remove the signal.

For example, in case the size of the audio signal was not adjusted at the dynamic range controller 132, a sound signal input into the microphone 120 includes the audio signal output through the speaker 110 as ④ in FIG. 5, and the audio signal has the same property as the audio signal input into the equalizer 131 (① in FIG. 5).

Accordingly, in case the size of the audio signal was not adjusted at the dynamic range controller 132, the acoustic echo cancellation part 135 performs acoustic echo cancellation using the audio signal input into the equalizer 131. In this case, the audio signal output through the speaker 110, and the audio signal input into the equalizer 131 have the same property, in a sound signal input into the microphone 120. Thus, an echo signal generated by the electronic device 100 in a sound signal input into the microphone 120 can be effectively removed.

In case the size of the audio signal output from the equalizer 131 was adjusted by the dynamic range controller 132, the audio processor 130 may perform acoustic echo cancellation based on the audio signal output from the dynamic range controller 132.

In this example, the audio processor 130 may adjust the size of the signal of a predetermined frequency band in the audio signal output from the dynamic range controller 132 to be opposite to the equalizer 131, and perform acoustic echo cancellation based on the adjusted audio signal.

For example, in case the size of the audio signal output from the equalizer 131 was adjusted by the dynamic range controller 132, the audio processor 130 may adjust the size of the signal of a predetermined frequency band in the audio signal output from the dynamic range controller 132.

In this example, the audio processor 130 may adjust the size of the signal of a predetermined frequency band in the audio signal output from the dynamic range controller 132 to be opposite to the adjustment at the equalizer 131.

For example, in case a signal of a specific frequency band became weak by the equalizer 131, the audio processor 130 may amplify the size of the signal of a specific frequency band in the audio signal output from the dynamic range controller 132, and in case a signal of a specific frequency band became strong by the equalizer 131, the audio processor 130 may reduce the size of the signal of a specific frequency band in the audio signal output from the dynamic range controller 132.

In addition, the audio processor 130 may determine a signal having a similar frequency property to the audio signal wherein the size of the signal of a specific frequency band was adjusted in a sound signal input through the microphone 120 as an echo signal, and remove the signal.

In this example, the audio processor 130 may include an error correction part 134 and an acoustic echo cancellation part 135, as illustrated in FIG. 4.

Figure 6:
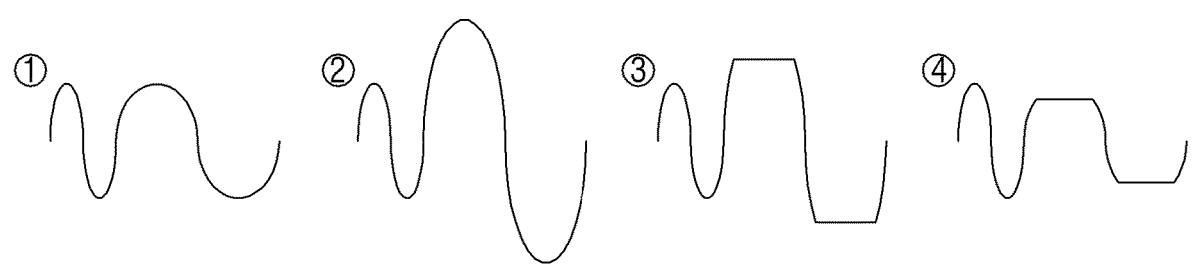
FIG. 6 is a diagram illustrating example waveforms of an audio signal according to an embodiment of the disclosure.
Figure 6:
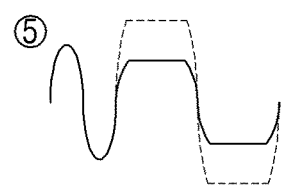

For example, the audio signal ① input into the equalizer 131 may be expressed as a waveform as ① in FIG. 6.

In this example, if the equalizer 131 amplifies the size of a signal of a low frequency band in the audio signal, the audio signal ② output from the equalizer 131 may be expressed as a waveform as ② in FIG. 6.

In case the size of the audio signal was adjusted by the dynamic range controller 132, the audio signal ③ output from the dynamic range controller 132 may be expressed as a waveform as ③ in FIG. 6. For example, referring to ③ in FIG. 6, it can be figured out that the signal of a portion of the audio signal ② that has high amplitude was clipped by the dynamic range controller 132.

When the audio signal is output through the speaker 110, the strength of the signal of a low frequency band becomes weak due to the property of the speaker 110. Thus, if the audio signal output through the speaker 110 is input into the microphone 120, the signal input into the microphone 120 may have a waveform as ④ in FIG. 6.

In case the size of the audio signal was adjusted at the dynamic range controller 132, the error correction part 134 may adjust the size of the signal of a predetermined frequency band in the audio signal output from the dynamic range controller 132 between the audio signal input into the equalizer 131 and the audio signal output from the dynamic range controller 132, and output the adjusted audio signal to the acoustic echo cancellation part 135.

For example, the error correction part 134 may adjust the size of the signal of a predetermined frequency band in the audio signal output from the dynamic range controller 132 to be opposite to the equalizer 131, using an inverse filter of the filter used for adjusting the size of the signal at the equalizer 131.

For example, in case the equalizer 131 amplified the size of a signal of a low frequency band, the error correction part 134 may reduce the size of the signal of a low frequency band as much as the degree of amplification by the equalizer 131. Accordingly, the waveform of the audio signal output from the error correction part 134 to the acoustic echo cancellation part 135 may be as ⑤ in FIG. 6.

Accordingly, the acoustic echo cancellation part 135 may remove an echo signal in a sound signal input into the microphone 120 using the audio signal input from the error correction part 134, and output the audio signal wherein the echo signal was removed.

For example, the acoustic echo cancellation part 135 may set the signal wherein the size of the signal of a predetermined frequency band was adjusted in the audio signal output from the dynamic range controller 132 as reference data, and through frequency analysis, determine a signal having a similar frequency property to reference data in a sound signal input through the microphone 120 as an echo signal, and remove the signal.

For example, in case the size of the audio signal was adjusted at the dynamic range controller 132, a sound signal input into the microphone 120 includes the audio signal output through the speaker 110 as ④ in FIG. 6, and the audio signal has the same property as the audio signal wherein the size of a predetermined frequency band was adjusted in the audio signal output from the dynamic range controller 132 (⑤ in FIG. 6).

Accordingly, in case the size of the audio signal was adjusted at the dynamic range controller 132, the acoustic echo cancellation part 135 performs acoustic echo cancellation using the audio signal output from the dynamic range controller 132. In this case, the audio signal output through the speaker 110, and the audio signal wherein the size of a predetermined frequency band was adjusted in the audio signal output from the dynamic range controller 132 have the same property, in a sound signal input into the microphone 120. Thus, an echo signal generated by the electronic device 100 in a sound signal input into the microphone 120 can be effectively removed.

As described above, according to the various embodiments of the disclosure, even when an audio signal is distorted by the operation of the dynamic range controller 132, acoustic echo cancellation can be performed effectively.

In the aforementioned example embodiment, it was described that acoustic echo cancellation is performed using an audio signal input into the equalizer 131. However, according to an example embodiment of the disclosure, the audio processor 130 may perform acoustic echo cancellation using an audio signal output from the equalizer 131 instead of an audio signal input into the equalizer 131. In this example, with respect to the audio signal output from the equalizer 131, the audio processor 130 may adjust the size of the audio signal output from the equalizer 131 to be opposite to the equalizer 131 using an inverse filter of the filter applied to the equalizer 131, and perform acoustic echo cancellation using the audio signal.

Figure 7:
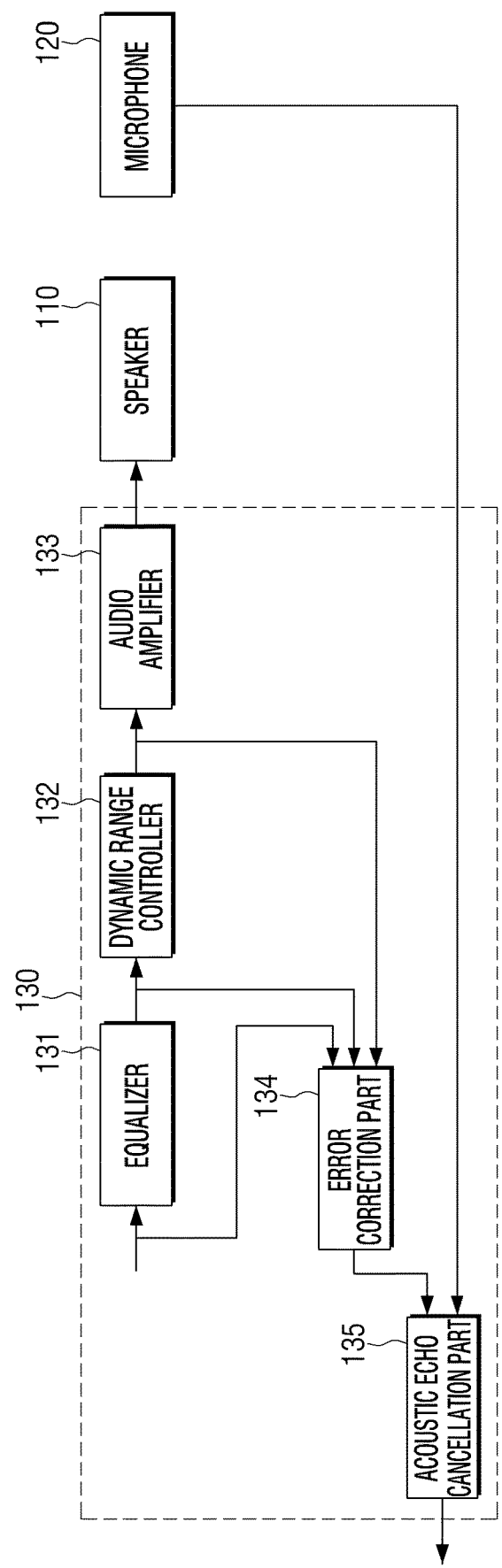
FIG. 7 is a block diagram illustrating an example configuration of an example electronic device according to an embodiment of the disclosure.

For example, as illustrated in FIG. 7, in case the size of the audio signal was not adjusted at the dynamic range controller 132, the error correction part 134 may adjust the size of the signal of a predetermined frequency band in the audio signal output from the equalizer 131, and output the adjusted audio signal to the acoustic echo cancellation part 135.

In this example, the error correction part 134 may adjust the size of the signal of a predetermined frequency band in the audio signal output from the equalizer 131 to be opposite to the equalizer 131, using an inverse filter of the filter used for adjusting the size of the signal at the equalizer 131. The error correction part 134 may output the adjusted audio signal to the acoustic echo cancellation part 135.

Accordingly, the acoustic echo cancellation part 135 may remove an echo signal in a sound signal input into the microphone 120 using the audio signal input from the error correction part 134, and output the audio signal wherein the echo signal was removed.

Figure 8:
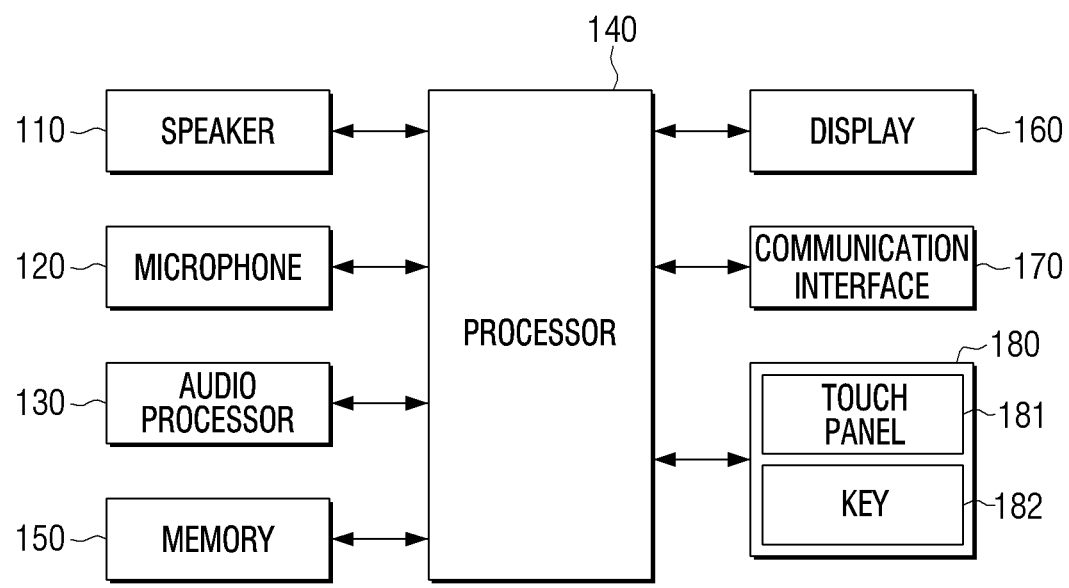
FIG. 8 is a block diagram illustrating an example configuration of an example electronic device according to an embodiment of the disclosure.

FIG. 8 is a block diagram illustrating an example configuration of an example electronic device according to an embodiment of the disclosure.

As illustrated in FIG. 8, the electronic device 100 may include a speaker 110, a microphone 120, an audio processor (e.g., including audio processing circuitry and/or executable program elements) 130, a processor (e.g., including processing circuitry) 140, a memory 150, a display 160, a communication interface (e.g., including communication interface circuitry) 170, and an input interface (e.g., including input interface circuitry) 180. In this example, the processor 140 may be electronically connected to these components, and control the overall operations and functions of the electronic device 100. The speaker 110, the microphone 120, and the audio processor 130 illustrated in FIG. 8 were described with reference to FIGS. 2 to 4, and thus overlapping explanation will not be repeated here.

The processor 140 may include various processing circuitry, such as, for example, and without limitation, one or more of a central processing unit, an application processor, a communication processor, or the like. Also, the processor 140 may control the electronic device 100. For example, the processor 140 may perform control of at least one component of the electronic device 100 and operation or data processing, and the like. The audio processor 130 may be distinguished from the processor 140, and included in the electronic device 100. However, according to another embodiment of the disclosure, the audio processor 130 may be included in the processor 140. According to still another embodiment of the disclosure, the audio processor 130 may be constituted as an independent module.

The memory 150 may store instructions and/or data related to at least one other component of the electronic device 100. The memory 150 may be implemented as a non-volatile memory, a volatile memory, a flash memory, a hard disk drive (HDD), or a solid state drive (SSD), etc., but the disclosure is not limited thereto. The memory 150 may be accessed by the processor 140, and reading/recording/correction/deletion/update, etc. of data by the processor 140 may be performed.

The display 160 may display various screens. For example, the display 160 may display various screens related to the operations of the electronic device 100.

In this example, the display 160 may be combined with the touch panel 181 and implemented as a touch screen in a layered structure. The touch screen may not only have a displaying function but also a function of detecting the location of a touch input, the touched area, and the pressure of a touch input, and it may also have a function of detecting a proximity touch as well as a real-touch.

The communication interface 170 may include circuitry as a component for performing communication with an external electronic device. In this example, communicative connection of the communication interface 170 with an external electronic device may include communication via a third device (e.g., a repeater, a hub, an access point, a server, or a gateway, etc.).

For example, the communication interface 170 may include components for wireless communication such as LTE and wireless fidelity (WiFi), and components for wired communication such as a universal serial bus (USB) and a high definition multimedia interface (HDMI). Networks wherein wireless communication or wired communication is performed may include telecommunication networks, for example, at least one of a computer network (e.g.: an LAN or a WAN), the Internet, or a telephone network.

The communication interface 170 may perform communication with an external server, and provide an artificial intelligence agent service.

The input interface 180 is a component for receiving input of various user commands, and may include circuitry. In this example, the input interface 180 may transmit an input user command to the processor 140. The input interface 180 may include, for example, a touch panel 181, or a key 182. The touch panel 181 may use, for example, at least one method among a capacitive method, a decompressive method, an infrared method, or an ultrasonic method. Also, the touch panel 181 may further include a control circuit. In addition, the touch panel 181 may further include a tactile layer, and provide a tactile response to a user. The key 182 may include, for example, a physical button, an optical key, or a keypad.

According to an embodiment of the disclosure, the processor 140 may provide a response to a user voice.

For example, while receiving input of a user voice, in case an audio signal is output from the speaker 110, a sound signal input into the microphone 120 may include the voice signal uttered by the user and the audio signal output from the speaker 110. In this case, through the aforementioned method, the audio processor 130 removes the audio signal output from the speaker 110 in the sound signal input into the microphone 120.

In this example, the processor 140 performs voice recognition using a sound signal wherein an echo signal was removed, i.e., a voice signal among sound signals input into the microphone 120. That is, a sound signal wherein acoustic echo was removed is used for voice recognition. Thus, according to an embodiment of the disclosure, the recognition rate for voice recognition can be further improved.

In this example, the processor 140 may provide a response to a user voice using an artificial intelligence agent program.

For example, the processor 140 may perform voice recognition for a voice signal and convert a user voice into a text, and based on the result of voice recognition, identify a domain, intention, and a parameter (or, a slot) necessary for identifying intention for a user voice. Then, the processor 140 may perform search, etc. according to the user intention and acquire a response to the user voice, process the acquired response as a natural language, and output the natural language to provide a response to the user voice.

For example, with respect to a user voice having intention of inquiring about the weather, the electronic device 100 may search the current weather and acquire a response to the user voice, process the response as a natural language, convert the acquired natural language into a voice through text to speech (TTS), and output it through the speaker 120 of the electronic device 100.

By the above process, the conversation system can provide a response to the user voice, and the user becomes capable of performing a conversation with the electronic device 100.

Figure 9:
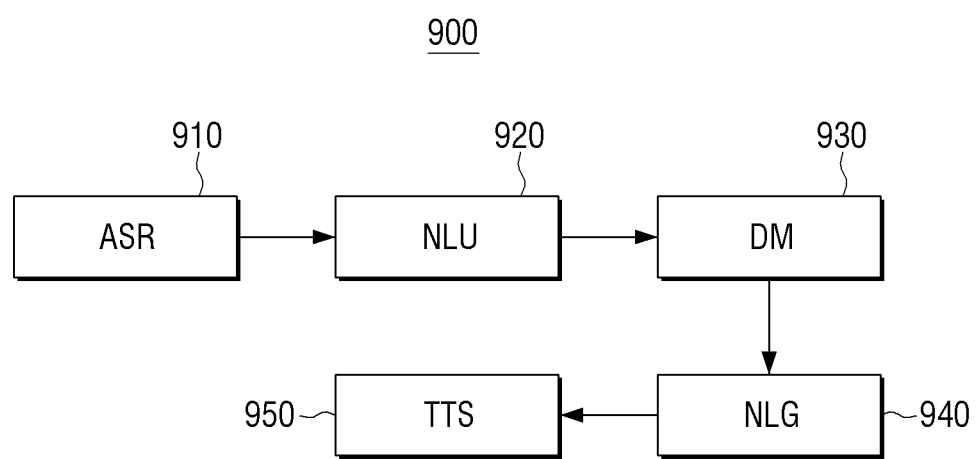
FIG. 9 is a block diagram illustrating an example conversation system of an example artificial intelligence agent system according to an embodiment of the disclosure.

For this, the memory 150 may include a plurality of modules of the conversation system as illustrated in FIG. 9. In this example, the processor 140 may provide a response to a user voice to a user using the plurality of components illustrated in FIG. 9.

As illustrated in FIG. 9, the conversation system 900 may include an automatic speech recognition (ASR) module (e.g., including processing circuitry and/or executable program elements) 910 for converting a voice signal for a user voice into a text, a natural language understanding (NLU) module (e.g., including processing circuitry and/or executable program elements) 920 for identifying intention, etc. for a user voice, a dialogue manager (DM) module (e.g., including processing circuitry and/or executable program elements) 930 for acquiring a response corresponding to user intention, a natural language generator (NLG) module (e.g., including processing circuitry and/or executable program elements) 940 for performing natural language processing for an acquired response, and a text to speech (TTS) module (e.g., including processing circuitry and/or executable program elements) 950 for converting a text processed as a natural language into a voice. Meanwhile, the conversation system 900 illustrated in FIG. 9 is a component for performing a conversation with a virtual artificial intelligence agent through a natural language, and according to an embodiment of the disclosure, the conversation system 900 may be stored inside the memory 150 of the electronic device 100. However, this is merely an example, and at least one module included in the conversation system 900 may be included in at least one external server.

Figure 10:
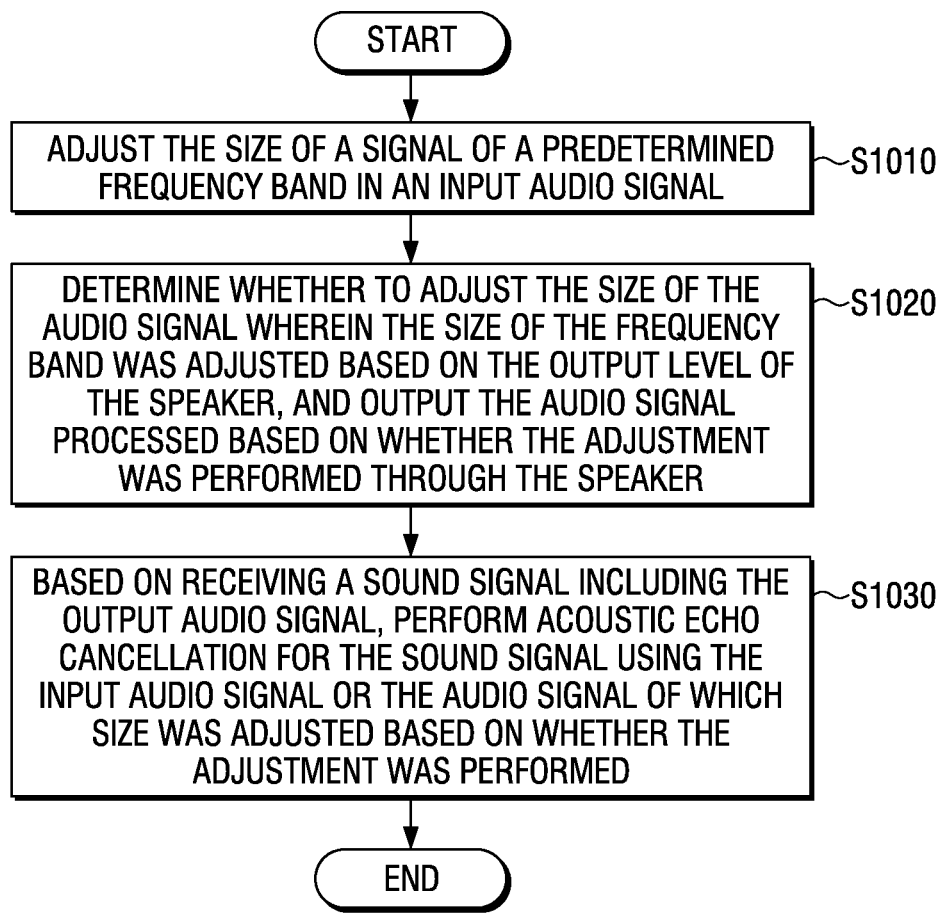
FIG. 10 is a flowchart illustrating an example method of controlling an electronic device according to an embodiment of the disclosure.

FIG. 10 is a flowchart illustrating an example method for controlling an electronic device according to an embodiment of the disclosure.

The size of a signal of a predetermined frequency band is adjusted in an input audio signal at operation S1010.

It is determined whether to adjust the size of the audio signal wherein the size of the frequency band was adjusted based on the output level of the speaker, and the audio signal processed based on whether the adjustment was performed is output through the speaker at operation S1020.

When a sound signal including the output audio signal is received through the microphone, acoustic echo cancellation for the sound signal is performed using the input audio signal or the audio signal of which size was adjusted based on whether the adjustment was made at operation S1030.

In this example, at operation S1010, the size of the signal of a predetermined frequency band may be adjusted in the input audio signal using the equalizer. At operation S1020, the size of the audio signal output from the equalizer may be adjusted based on the output level of the speaker using the dynamic range controller, and the audio signal output from the dynamic range controller may be amplified and output through the speaker.

At operation S1020, based on whether the size of the audio signal output from the equalizer was adjusted by the dynamic range controller, acoustic echo cancellation may be performed using the audio signal input into the equalizer or the audio signal output from the dynamic range controller.

In addition, at operation S1030, in case the size of the audio signal output from the equalizer was not adjusted by the dynamic range controller, acoustic echo cancellation may be performed using the audio signal input into the equalizer.

At operation S1030, in case the size of the audio signal output from the equalizer was adjusted by the dynamic range controller, acoustic echo cancellation may be performed using the audio signal output from the dynamic range controller. In this case, the size of the signal of a predetermined frequency band in the audio signal output from the dynamic range controller may be adjusted to be opposite to the equalizer, and acoustic echo cancellation may be performed based on the adjusted audio signal.

Further, a sound signal wherein acoustic echo was removed may be used for voice recognition.

A detailed method of performing acoustic echo cancellation using a specific audio signal according to whether the dynamic range controller operates was explained earlier.

Meanwhile, the term "a part" or "a module" used in the disclosure includes a unit including hardware, software, or firmware, or any combination thereof, and it may be interchangeably used with terms such as logic, a logical block, a component, or a circuit. Also, "a part" or "a module" may be a component consisting of an integrated body or a minimum unit performing one or more functions or a portion thereof. For example, a module may consist of an application-specific integrated circuit (ASIC).

The various embodiments of the disclosure may be implemented as software including instructions stored in machine-readable storage media, which can be read by machines (e.g.: computers). The machines refer to apparatuses that call instructions stored in a storage medium, and can operate according to the called instructions, and the apparatuses may include an electronic device according to the aforementioned embodiments (e.g.: an electronic device 100). In case such an instruction is executed by a processor, the processor may perform a function corresponding to the instruction by itself, or using other components under its control. An instruction may include a code made by a compiler or a code executable by an interpreter. A storage medium that is readable by machines may be provided in the form of a non-transitory storage medium. The 'non-transitory' storage medium may not include signals, and is tangible, and does not indicate whether data is stored in the storage medium semi-permanently or temporarily.

Also, according to an embodiment of the disclosure, methods according to the various embodiments described in the disclosure may be provided while being included in a computer program product. A computer program product refers to a product, and it can be traded between a seller and a buyer. A computer program product can be distributed on-line in the form of a storage medium that is readable by machines (e.g.: a compact disc read only memory (CD-ROM)), or through an application store. In the case of on-line distribution, at least a portion of a computer program product may be stored in a storage medium such as the server of the manufacturer, the server of the application store, and the memory of the relay server at least temporarily, or may be generated temporarily.

Further, each of the components according to the aforementioned various embodiments (e.g.: a module or a program) may consist of a singular object or a plurality of objects. Also, among the aforementioned corresponding sub components, some sub components may be omitted, or other sub components may be further included in the various embodiments. Generally or additionally, some components (e.g.: a module or a program) may be integrated as an object, and perform the functions that were performed by each of the components before integration identically or in a similar manner. A module, a program, or operations performed by other components according to the various embodiments may be executed sequentially, in parallel, repetitively, or heuristically. Or, at least some of the operations may be executed or omitted in a different order, or other operations may be added.

While various example embodiments have been illustrated and described, it will be understood that the example embodiments are intended to be illustrative, and not limiting. It will be understood that various changes in form and details may be made without departing from the true spirit and full scope of the disclosure, examples of which are recited in the appended claims and equivalents thereto.

What is claimed is:

1. An electronic device comprising:
 a speaker;
 a microphone; and
 an audio processor configured to:
 adjust a size of a signal of a predetermined frequency band in an input audio signal to provide a first adjusted audio signal,
 determine whether to adjust the size of the first adjusted audio signal based on an output level of the speaker, and output a second adjusted audio signal toward the speaker, the second adjusted audio signal selectively comprising, based on the output level of the speaker, either: (a) the first adjusted audio signal whose size is adjusted based on the output level of the speaker, or (b) the first adjusted audio signal whose size being not adjusted,
 wherein the audio processor is further configured to:
 perform acoustic echo cancellation (AEC) for a sound signal received from the speaker through the microphone selectively using either: (i) the input audio signal, or (ii) the second adjusted audio signal comprising the first adjusted audio signal whose size is adjusted based on the output level of the speaker, wherein the selection of (i) or (ii) for the AEC is based on whether the size of the first adjusted audio signal is adjusted based on the output level of the speaker.

2. The electronic device of claim 1,
 wherein the audio processor comprises:
 an equalizer configured to provide the first adjusted audio signal by adjusting the size of the input audio signal;
 a dynamic range controller configured to provide the second adjusted audio signal by selectively adjusting the size of the first adjusted audio signal output from the equalizer based on the output level of the speaker; and
 an audio amplifier configured to amplify the second adjusted audio signal output from the dynamic range controller.

3. The electronic device of claim 2,
 wherein the audio processor is configured to:
 perform the acoustic echo cancellation using the input audio signal input into the equalizer or the second adjusted audio signal output from the dynamic range controller based on whether the size of the first adjusted signal output from the equalizer is adjusted by the dynamic range controller.

4. The electronic device of claim 3,
 wherein the audio processor is configured to:
 based on the size of the first adjusted audio signal output from the equalizer not having been adjusted by the dynamic range controller, perform the acoustic echo cancellation based on the audio signal input into the equalizer.

5. The electronic device of claim 3,
 wherein the audio processor is configured to:
 based on the size of the first adjusted audio signal output from the equalizer having been adjusted by the dynamic range controller to form the second adjusted audio signal, perform the acoustic echo cancellation based on the second adjusted audio signal output from the dynamic range controller.

6. The electronic device of claim 5,
 wherein the audio processor is configured to:
 provide a third adjusted signal by adjusting the size of the signal of a predetermined frequency band in the second adjusted audio signal output from the dynamic range controller to be opposite to the equalizer, and perform the acoustic echo cancellation based on the third adjusted signal.

7. The electronic device of claim 1,
 wherein the sound signal in which acoustic echo is cancelled is used for voice recognition.

8. The electronic device of claim 1,
 wherein the predetermined frequency band is a frequency band set in advance according to the property of the speaker.

9. The electronic device of claim 1,
 wherein the adjustment of the size of the signal of a frequency band set in the input audio signal is adjusted based on a property of the speaker, wherein a difference between the audio signal output from the speaker and the input audio signal is compensated.

10. A method of controlling an electronic device comprising a microphone and a speaker, the method comprising:
 adjusting a size of a signal of a predetermined frequency band in an input audio signal to provide a first adjusted audio signal;
 determining whether to adjust the size of the first adjusted audio signal based on an output level of the speaker, and
 based on said determining, outputting a second adjusted audio signal toward the speaker, the second adjusted audio signal selectively comprising, based on the output level of the speaker, either: (a) the first adjusted audio signal whose size is adjusted based on the output level of the speaker, or (b) the first adjusted audio signal whose size being not adjusted; and
 performing acoustic echo cancellation (AEC) for a sound signal received from the speaker through the microphone selectively using either: (i) the input audio signal, or (ii) the second adjusted audio signal comprising the first adjusted audio signal whose size is adjusted based on the output level of the speaker, wherein the selection of (i) or (ii) for the AEC is based on whether the size of the first adjusted audio signal is adjusted based on the output level of the speaker.

11. The method of claim 10, further comprising:
providing the first adjusted audio signal by adjusting the size of a signal of a predetermined frequency band in the input audio signal using an equalizer, and
wherein the outputting comprises: adjusting the size of the first adjusted audio signal output from the equalizer based on the output level of the speaker using a dynamic range controller, and amplifying the second adjusted audio signal output from the dynamic range controller and outputting the amplified signal to the speaker.

12. The method of claim 11, comprising:
performing the acoustic echo cancellation selectively using either the audio signal input into the equalizer, or the second adjusted audio signal output from the dynamic range controller, based on whether the size of the first adjusted audio signal output from the equalizer is adjusted by the dynamic range controller.

13. The method of claim 12,
wherein the performing comprises:
performing the acoustic echo cancellation based on the audio signal input into the equalizer based on the size of the first adjusted audio signal output from the equalizer not having been adjusted by the dynamic range controller.

14. The method of claim 12,
wherein the performing comprises:
performing the acoustic echo cancellation based on the second adjusted audio signal output from the dynamic range controller based on the size of the first adjusted audio signal output from the equalizer having been adjusted by the dynamic range controller.

15. The method of claim 14,
wherein the performing comprises:
provide a third adjusted signal by adjusting the size of the signal of a predetermined frequency band in the second adjusted audio signal output from the dynamic range controller to be opposite to the equalizer, and performing the acoustic echo cancellation based on the third adjusted signal.

16. The method of claim 10,
wherein the sound signal wherein acoustic echo is cancelled is used for voice recognition.

17. The method of claim 10,
wherein the predetermined frequency band is a frequency band set in advance according to the property of the speaker.

18. The method of claim 10,
wherein the adjustment of the size of the signal of a frequency band set in the input audio signal is adjustment based on a property of the speaker so that a difference between the audio signal output from the speaker and the input audio signal is compensated.

* * * * *